(12) United States Patent
Wu et al.

(10) Patent No.: US 7,936,187 B1
(45) Date of Patent: May 3, 2011

(54) SWITCH-BODY NMOS-PMOS SWITCH WITH COMPLEMENTARY CLOCKED SWITCH-BODY NMOS-PMOS DUMMIES

(75) Inventors: Qiong Wu, San Jose, CA (US); Kevin Mahooti, Sunnyvale, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/630,708

(22) Filed: Dec. 3, 2009

(51) Int. Cl.
    *G11C 27/02* (2006.01)
(52) U.S. Cl. ............................................ 327/94; 327/91
(58) Field of Classification Search .................... 327/91, 327/94, 97; 341/122
    See application file for complete search history.

(56) References Cited

U.S. PATENT DOCUMENTS

| | | | | |
|---|---|---|---|---|
| 4,308,468 A | * | 12/1981 | Olson | 327/94 |
| 5,019,731 A | * | 5/1991 | Kobayashi | 327/434 |
| 5,111,072 A | * | 5/1992 | Seidel | 327/94 |
| 6,265,911 B1 | * | 7/2001 | Nairn | 327/94 |
| 7,015,729 B1 | * | 3/2006 | Tursi et al. | 327/94 |
| 7,119,585 B2 | * | 10/2006 | Ranganathan | 327/94 |

* cited by examiner

*Primary Examiner* — Hai L Nguyen

(57) ABSTRACT

A sample-and-hold feed switch has parallel PMOS branches and parallel NMOS branches, each extending from an input node to an output node connected to a hold capacitor. Each PMOS branch has a PMOS switch FET connected to a matching PMOS dummy FET, and each NMOS branch has an NMOS switch FET connected to a matching NMOS dummy FET. A sample clock switches the PMOS switch FETs on and off, and a synchronous inverse sample clock effects complementary on-off switching of the PMOS dummy FETs. Concurrently, a synchronous inverse sample clock switches the NMOS switch FETs on and off, and the sample clock effects a complementary on-off switching of the NMOS dummy FETs. A bias sequencer circuit biases the bodies of the PMOS switch FETs and the bodies of the PMOS dummy FETs, in a complementary manner, and biases the NMOS switch FETs and the NMOS dummy FETs, also in a complementary manner. The on-off switching of the PMOS dummy FETs injects charge, cancelling a charge injection by the PMOS signal switch FETs, and injects glitches cancelling glitches injected by the PMOS signal switch FETs. The on-off switching of the NMOS dummy FETs injects charge that cancels a charge injection by the NMOS signal switch FETs, and injects glitches that cancels glitches injected by the NMOS signal switch FETs.

20 Claims, 5 Drawing Sheets

SWITCH-BODY NMOS-PMOS SWITCH WITH COMPLEMENTARY CLOCKED SWITCH-BODY NMOS-PMOS DUMMIES

TECHNICAL FIELD

The technical field relates generally to circuits for sampling and holding an instantaneous value of a time-varying electrical signal.

BACKGROUND

A sample-and-hold ("S/H") circuit (hereinafter referenced generically as a "S/H circuit") has a signal input terminal, a S/H clock input terminal, and a held signal output terminal. The S/H circuit receives, on the signal input terminal, an electrical signal with one or more time varying attributes such as, for example, amplitude or phase, and receives a sampling clock on the S/H clock input terminal. In response to a sampling command event such as, for example, one of a rising or falling edge of the S/H clock, the S/H circuit takes and then holds, on the held signal output terminal, a sample of the input signal.

Sample and hold circuits are used in a wide variety of applications such as, for example, analog-to-digital converter ("ADC") devices, by sampling a time-varying input signal and presenting the held value to the signal input terminal of the ADC, to meet the set-up and hold requirements of the ADC comparators. Another example application is a "deglitcher" at the output of a digital-to-analog converter ("DAC"), to sample the DAC output at delay after the DAC clock that is sufficient to allow output glitches to settle.

The sample held on the held signal output terminal of the S/H circuit is, ideally, the exact value of the input signal that existed at an exact point in space, at an exact point in time, where "exact" means accurate to infinite precision.

It has been long known, however, to persons of ordinary skill in the arts pertaining to S/H circuits that actual operating S/H circuits suffer from various non-ideal characteristics by which the actual sample at a given time after the sampling instant is not, in fact, the exact value of the input signal that was extant at that instant. These non-ideal characteristics include, for example, sampling jitter, meaning the statistical variance of the time difference between the ideal hold clock event and the instant that the S/H actually holds the sampled value; acquisition time, meaning the time required for the S/H circuit to charge the hold capacitor to the sampled signal value: as well as charge injection; clock feedthrough and pedestal error.

Various known methods are directed to reducing or compensating, at least in part, one or more of the above-identified non-ideal characteristics of actual S/H circuits.

For example, the simplest signal switch component of an S/H circuit is a single transistor fabricated by a MOS process, such as a PMOS FET or NMOS FET. Each of the PMOS FET and NMOS FET is controlled by a clock signal that swings between the MOS supply voltage $V_{DD}$ and the system ground. One problem inherent in a single transistor PMOS FET or NMOS FET structure, though, is that FETs require a threshold gate-to-source voltage, generally termed $V_{TH}$, to switch ON, meaning to form a conducting channel extending under the gate from the source to the drain. The lowest signal voltage that can be transferred by a PMOS device is therefore equal to $0+V_{TH}$, and the highest voltage for an NMOS device is therefore equal to $V_{DD}-V_{TH}$.

To avoid this inherent shortcoming, and to provide other benefits known in the arts pertaining to S/H circuits, the complementary MOSFET (CMOS) switch was introduced and is now well known in the S/H arts. A typical CMOS switch includes a PMOS FET and an NMOS FET, connected in parallel, with a clock connected to the PMOS FET gate and a complement of that clock connected to the NMOS FET gate. The parallel PMOS and NMOS FETs turn ON and OFF concurrently, subject to time differences between the edges of the CLK and NCLK.

Related art CMOS S/H switch circuits, however, have inherent shortcomings. One is a signal-dependent ON resistance, which causes the related art. CMOS S/H switch circuits have an inherent non-linearity.

Various methods directed at this inherent non-linearity of CMOS switches have been long known. All have also been long known as having significant shortcomings. For example, one method is to significantly boost the gate control voltage "$V_G$," which lowers the "$(V_G-V_S)/V_S$" variation caused by the signal variation at the source "$V_S$" of the MOS switch. Boosting the gate voltage, though, has limited effectiveness. Further, the increased gate voltage often results in an increased risk of accelerated device failure.

Another of these methods, often referenced as the "bootstrap" method, makes the gate voltage follow the analog input signal with an offset to turn the switch ON and to keep "$V_{GS}$" constant, thereby maintaining a somewhat constant ON resistance. However, the offset voltage must be high enough to turn the switch ON with low on-resistance but, at the same time, must be low enough to limit the stress added on the gate to be lower than the breakdown level.

Another limitation of the bootstrap method, long known in the arts pertaining to S/H circuits, is that the bootstrap circuitry controls "$V_{GS}$", but provides nothing to control the source-to-body voltage dependence, or $V_{SB}$ dependence of the MOS devices on-resistance in the CMOS switch. $V_{SB}$ dependence of the on-resistance is another linearity error source. Conventional methods directed to reducing "$V_{SB}$" related linearity error include forcing the error to zero by shorting the body terminals of MOS FETs to their source terminals while in the sample mode. This method, though, has been long known as not attaining S/H circuit performance that is acceptable for many applications.

SUMMARY

Sample and hold circuits according to one example embodiment include a particular combination and arrangement of parallel NMOS signal ON-OFF switch branches, combined with parallel PMOS signal ON-OFF switch branches, each of the signal ON-OFF branches extending from a signal input node to an output node. According to one aspect, the output node may be connected to, or may be a structure of a holding capacitor.

According to one aspect, the parallel NMOS signal ON-OFF switch branches may include a first NMOS signal switch branch in parallel with a second NMOS signal switch branch, each NMOS signal switch branch having an NMOS switch FET, the first NMOS switch FET in the first NMOS signal switch branch connecting its source to the input node and its drain to the output node, and the second NMOS switch FET in the second NMOS signal switch branch connecting its drain to the input node and its source to the output node, similarly, the parallel PMOS signal ON-OFF switch branches may include a first PMOS signal switch branch in parallel with a second PMOS signal switch branch, each PMOS signal switch branch having a PMOS switch FET, the first PMOS switch FET in the first PMOS signal switch branch connecting its source to the input node and its drain to the output node, and the second PMOS switch FET in the second PMOS signal switch branch connecting its drain to the input node and its source to the output node.

According to one aspect of one example embodiment, each of the PMOS switch FETs has a gate receiving a clock (CLK) signal switching between a first voltage such as, for example, a given ground (GND) and a second voltage such as, for example, a supply rail voltage $V_{DD}$, and each of the NMOS signal FETs has a gate receiving an inverse NCLK of the CLK signal. In accordance with one example, the CLK and NCLK states may embody a sampling state and a hold state. According to this example, the sampling state may be the CLK at GND and the NCLK at $V_{DD}$, thereby turning ON the PMOS switch FETs in the parallel first and second PMOS signal switch branches and, likewise, turning ON the NMOS switch FETs in the parallel first and second NMOS signal switch branches so as to connect the input node to the output node. Likewise, the hold state may be the CLK at $V_{DD}$ and the NCLK at GND, thereby turning OFF the PMOS switch FETs in the parallel first and second PMOS signal switch branches and, likewise, turning OFF the NMOS switch FETs in the parallel first and second NMOS signal switch branches, so as to isolate the output node from the input node.

According to one example of one or more various embodiments, the PMOS signal switch branches include the first PMOS signal switch branch having a first PMOS dummy FET in series with the first PMOS switch FET, the first PMOS dummy FET located between the input node and the source of the first PMOS switch FET, and the second PMOS signal switch branch having a second PMOS dummy FET also connected in series with the second PMOS switch FET, with the second PMOS dummy FET arranged between the output node and the source of the second PMOS switch FET. Similarly, the NMOS signal switch branches include the first NMOS signal switch branch having a first NMOS dummy FET in series with the first NMOS switch FET, the first NMOS dummy FET located between the input node and the source of the first NMOS switch FET, and the second NMOS signal switch branch having a second NMOS dummy FET also connected in series with the second NMOS switch FET, with the second NMOS dummy FET arranged between the output node and the source of the second NMOS switch FET.

According to one aspect of one example embodiment, each of the PMOS dummy FETs has a gate receiving an inverse clock signal (NCLK) of the CLK and each of the NMOS dummy FETs has a gate receiving clock signal (CLK), in response to the CLK and NCLK switching to a sampling state, a complementary switching OFF of the PMOS dummy FETs and the NMOS dummy FETs concurrent with switching ON of the PMOS switch FETs and the NMOS switch FETs, respectively, in the sampling state and, in response to the CLK and NCLK switching to a hold state, a complementary switching ON of the PMOS dummy FETs and NMOS dummy FETs concurrent with a switching OFF of the PMOS switch FETs and the NMOS switch FETs, respectively.

Sample and hold circuits according to one example of one or more various embodiments include the PMOS switch FET in each of the PMOS signal switch branches having a body connection connected to, and biased by, a FET bias sequencer generating a certain sequence of different PMOS switch FET bias levels, the sequence being synchronized with the CLK signal and, likewise, the NMOS switch FET in each of the NMOS signal switch branches having a body connection connected to, and biased by, a FET bias sequencer generating a certain sequence of different NMOS switch FET bias levels, the sequence being synchronized with the NCLK signal.

According to one aspect of one example of one or more various embodiments, the certain sequence of different PMOS switch FET bias levels and the concurrent certain sequence of different NMOS switch FET bias levels includes, during the sampling interval in which the PMOS switch FETs and the NMOS switch FETs ON with a channel created under each of the gates of the switch FETs, connecting the input node to the bodies of the switch FETs, biasing the bodies of each of the PMOS switch FETs and the bodies of each of the NMOS switch FETs to the signal voltage on the input node.

Among other features and benefits, this one aspect of one or more example embodiments reduces the "on-resistance" of the PMOS switch FETs and the "on resistance" of the NMOS switch FETs and, further, removes the first-order nonlinearity error due to the body effect.

According to one aspect of one example according to one or more embodiments, a sequence of specific and different bias levels includes, during the holding interval, in which the PMOS switch FETs and the NMOS switch FETs are OFF, biasing the bodies of the PMOS switch FETs to $V_{DD}$ and biasing the bodies of the NMOS switch FETs to GND, to create a depletion region under the gates of the switch FETs and to further isolate the input node from the holding capacitor.

Sample and hold circuits according to one various example embodiments include the PMOS dummy FETs in each of the PMOS signal switch branches having a body connection connected to, and biased by, a FET bias sequencer generating a certain sequence of different PMOS dummy FET bias levels, the sequence being synchronized with the NCLK signal and, likewise, the NMOS dummy FETs in each of the NMOS signal switch branches having a body connection connected to, and biased by, a FET bias sequencer generating a certain sequence of different NMOS dummy FET bias levels, the sequence being synchronized with the CLK signal.

According to one aspect of one or more various example embodiments, the certain sequence of specific and different bias levels includes, during the sampling interval, biasing the bodies of the PMOS dummy FETs to $V_{DD}$, and the bodies of the NMOS dummy FETs to GND, to create a depletion region under the gates of each of the PMOS dummy FETs and under the gates of each of the NMOS dummy FETs.

According to one aspect of one or more example embodiments, the certain sequence of specific and different bias levels includes, during the holding interval, biasing the bodies of the PMOS dummy FETs and the bodies of the NMOS dummy FETs to the sampled voltage at the output node to create a channel under the gates of each of the PMOS dummy FETs and under the gates of each of the NMOS dummy FETs.

According to one aspect of various example embodiments, the first PMOS switch FET and the second PMOS switch FET may have a mutually identical geometry, and mutually identical performance-related dimensions and mutually identical physical implementation orientation, further, the first dummy PMOS FET may have approximately the same geometry, the same performance-related dimensions and the same physical implementation orientation as the first PMOS switch FET, and the second dummy PMOS FET may have approximately the same geometry, the same performance-related dimensions and the same physical implementation orientation as the second PMOS switch FET.

According to one aspect of various example embodiments, the first NMOS switch FET and the second NMOS switch FET may have a mutually identical geometry, and mutually identical performance-related dimensions and mutually identical physical implementation orientation, further, the first dummy NMOS FET may have approximately the same geometry, the same performance-related dimensions and the same physical implementation orientation as the first NMOS switch FET, and the second dummy NMOS FET approximately the same geometry, the same performance-related dimensions and the same physical implementation orientation as the second NMOS switch FET.

According to one aspect of one or more various embodiments, the PMOS switch FETs and the PMOS dummy FETs are constructed and arranged such that the total charge expelled from the source and the drain of the PMOS switch FETs in extinguishing the conductive P channel and forming a depletion region for switching from the sampling mode to the hold mode is equal to the total charge drawn by the PMOS dummy FETs in filling their respective depletion regions and forming their respective P channels.

According to one aspect of one or more various embodiments, the NMOS switch FETs and the NMOS dummy FETs are constructed and arranged such that the total charge expelled from the source and the drain of the NMOS switch FETs in extinguishing the conductive N channel and forming a depletion region for switching from the sampling mode to the hold mode is equal to the total charge drawn by the NMOS dummy FETs in filling their respective depletion regions and forming their respective N channels.

According to one or more various embodiments, each PMOS switch FET has a gate-to-source coupling capacitance substantially equal to the gate-to-source coupling capacitance of its associated PMOS dummy FET, and has a gate-to-drain coupling capacitance substantially equal to the gate-to-drain coupling capacitance of its associated PMOS dummy FET.

According to one or more various embodiments, each NMOS switch FET has a gate-to-source coupling capacitance substantially equal to the gate-to-source coupling capacitance of its associated NMOS dummy FET, and has a gate-to-drain coupling capacitance substantially equal to the gate-to-drain coupling capacitance of its associated NMOS dummy FET.

According to one aspect of one or more example embodiments, combined with parallel PMOS switch FETs each having a matched PMOS dummy FET, parallel NMOS switch FETs each having a matched NMOS dummy FET, a complementary clocking of the switch FETs and the dummy FETs, and a complementary biasing of the switch FETs and the dummy FETs, a clock generation circuit generates the CLK and the NCLK to have a synchronous timing, to control synchronous generation of charge injection by the switch FETs and a cancelling charge taken by the dummy FETs, and synchronous generation of clock feedthrough at the switch FETs of one polarity and generation of cancelling clock feedthrough of an opposite polarity at the corresponding dummy FETs.

The above-summarized illustrative examples of embodiments and of illustrations, as well as the above illustrative advantages, features and benefits of each are not intended to be exhaustive or limiting. Other advantages of the various exemplary embodiments will be apparent from the various embodiments and aspects that are further described with illustrative detail, and persons of ordinary skill in the art will, upon reading this disclosure, readily identify further variations within the scope of the appended claims, as well as additional applications.

DETAILED DESCRIPTION

Various illustrative examples of S/H circuits having one or more exemplary embodiments of the invention, as well a various examples of various sub-sections and sub-structures, and various example components of such circuits, sub-sections and sub-structures are described. The specific examples are only for illustrative purposes, selected to further assist a person of ordinary skill in the art of sample-and-hold circuits in forming an understanding of the concepts sufficient for such a person, applying the knowledge and skills such person possesses, to practice the invention. The scope of structures, arrangements and materials capable of practicing or implementing one or more of the embodiments, though, is not limited to these specific illustrative examples.

The figures are included to assist, by way of graphical illustration, persons of ordinary skill in the art in forming a clear understanding of the disclosed subject matter. It will be understood, though, that the figures are not hardware specifications or fabrication drawings as, for example, graphical symbols may be sized and placed for ease of viewing and not to represent a structural quantity.

To avoid obscuring novel features and aspects of the embodiments, unnecessary details of various technical background that is known to persons of ordinary skill in the art, such as, for example, relevant semiconductor fabrication and design rules, and circuit simulation tools are omitted.

Example embodiments and aspects may be described separately, and as having certain differences. Separate description or description of differences, however, does not necessarily mean the respective embodiments or aspects are mutually exclusive. For example, a particular feature, function, or characteristic described in relation to one embodiment may be included in, or adapted for other embodiments.

Referring now to the figures, illustrative examples of and among the various arrangements, architectures, systems and structures for practicing one or more of the various example embodiments will be described.

Figure 1:
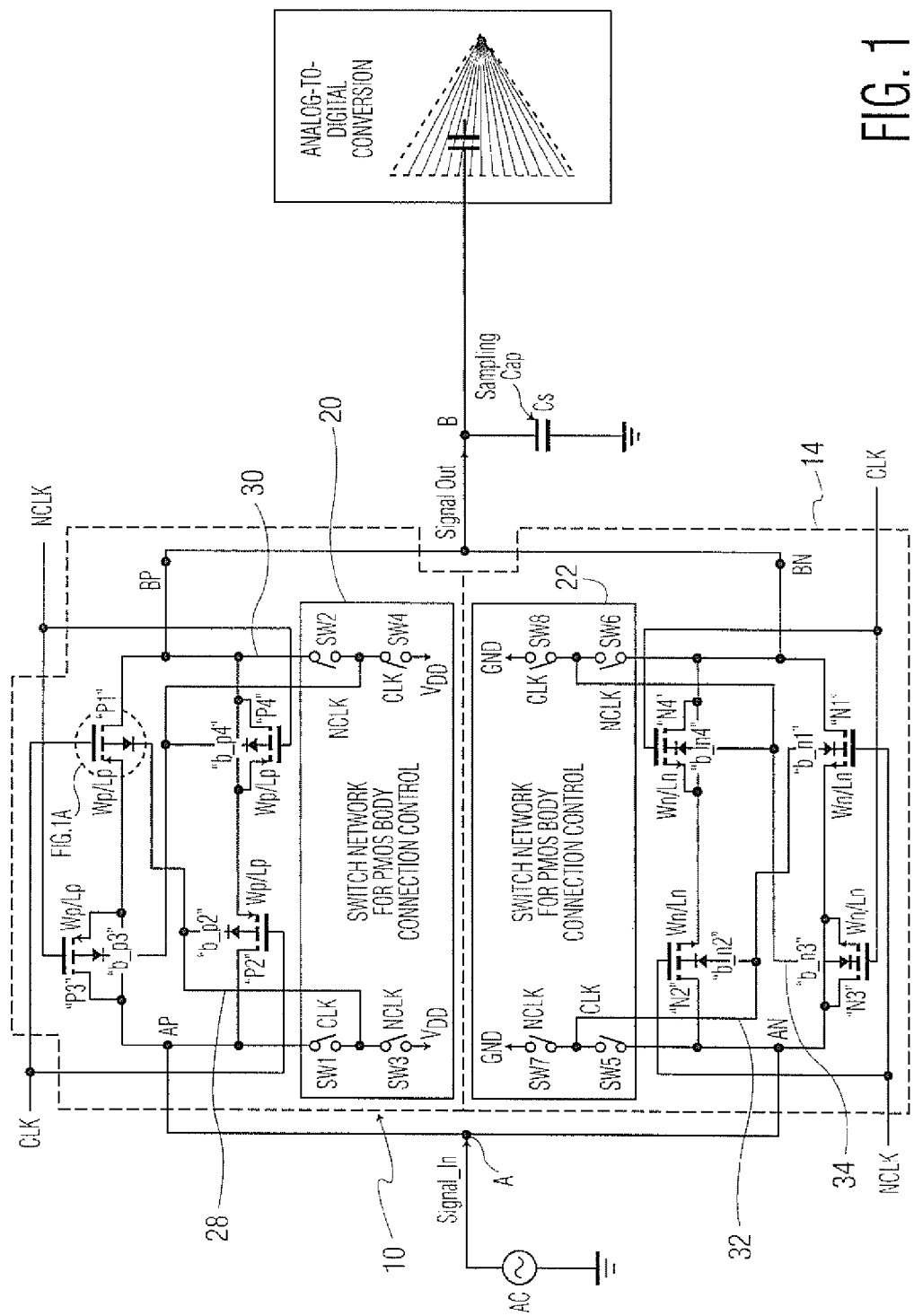
FIG. 1 shows a functional block diagram of one example implementation of one complementary clocked and biased NMOS-PMOS S/H switch having one example aspect of complementary clocked and biased NMOS-PMOS dummy FETs, according to one or more embodiments.
Figure 1A:
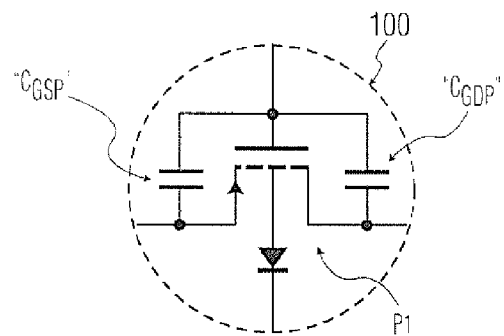

FIG. 1 shows an example circuit diagram representing one illustrative example implementation of an example NMOS-PMOS FET S/H feed switch 10 according to one or more of the embodiments. The example 10 includes a PMOS S/H switch circuit 12 and an NMOS S/H switch circuit 14 forming, as will be described in greater detail in later sections, parallel switch paths connecting and isolating an input node A to and from an output node B.

It will be understood that the terms "sample and hold" and "S/H" are not limitations on the structure of NMOS-PMOS FET switch circuits according to the described embodiments, or on the scope of applications or combinations in which the embodiments may be practiced. Instead, the terms "sample and hold," including the label "S/H" preceding "feed switch 10," reference only one example application within the scope of applications, namely the cyclical connection (i.e., sampling) of an input signal on node A to a holding capacitor Cs on node B, and isolation (i.e., holding) of that signal from Cs.

With continuing reference to FIG. 1, in the depicted example 10 the respective input nodes AP and AN of the PMOS S/H switch circuit 12 and the NMOS S/H switch circuit 14 are connected together and to the common input node A. Likewise, the respective output nodes BP and BN of the PMOS and the NMOS S/H switch circuits 12 and 14 are connected together and to the common output node B. The PMOS S/H switch circuit 12 and the NMOS switch circuit 14 preferably each comprise at least one pair of parallel switch FET branches. This is depicted in the example 10 as a pair of parallel PMOS switch FET branches, implemented by the PMOS switch FETs P1 and P2 connected in parallel between the input node AP and the output node BP. Likewise, the pair of NMOS switch FETs N1 and N2, form parallel NMOS branches between the NMOS circuit 14 input node AN and its output node BN.

Continuing to refer to FIG. 1, according to one aspect, in at least one pair of the respective FET branches forming each of the PMOS and the NMOS circuits 12 and 14, each of the branches includes a dummy FET connected directly to the source of the switch FET in the branch. The dummy FETs provide certain charge injection cancellation, and clock feedthrough cancellation functions, operations and benefits, as described in greater detail in later sections of this disclosure. As also described, certain aspects of the position of the dummy FETs relative to their corresponding switch FETs and to the input and output nodes of the switch circuits (i.e., AP, BP, AN and BN,) and their respective connections to their corresponding switch FETs, pertain to these functions and benefits.

In the FIG. 1 example 10, referring to the PMOS switch circuit 12, a PMOS dummy FET P3 has its source connected directly to the source of the PMOS switch FET P1 forming one PMOS branch, and a PMOS dummy FET P4 has its source connected directly to the source of the PMOS switch FET P2 forming the other PMOS branch. As shown by the respective conductors connecting the source and drain of each of the PMOS dummy FETs P3 and P4, these FETs serve no signal switching function with respect to connecting, or isolating, the input node AP to or from the output node BP, hence the term "dummy FET." Similarly, in the FIG. 1 example 10 NMOS switch circuit 14, the source of an NMOS dummy FET N3 connects directly to the source of the NMOS switch FET N1 forming one NMOS branch, and the source of an NMOS dummy FET N4 connects directly to the source of the NMOS switch FET N2 forming the other NMOS branch.

Continuing to refer to FIG. 1, according to one aspect the source of the PMOS switch FET P1 faces toward the input node AP, while the source of the parallel branch PMOS switch FET P2 faces toward the output node BP. Since the sources of the PMOS dummy FETs P3 and P4 each connect directly to the source of their corresponding PMOS switch FET P1 and P2, these source-to-source connections of the dummy FETs to their corresponding switch FET are fixed, regardless of the switch state of the FETs P1 and P2. As will be further understood from additional detailed description below, the dummy FET P3 being located between the input node AP and the source of the PMOS switch FET P1 provides for the dummy FET P3 to be controlled, by clock and bias sequence features of the various embodiments, to inject canceling charges into the input node AP. Similarly, the location and arrangement of the dummy FET P4, i.e., between the source of the PMOS switch FET P2 and the output node BP, allows that dummy FET P4, under control of the clocking and FET body bias sequence aspects of various embodiments, to inject canceling charges into the output node BP (and, for example, the holding capacitor Cs).

With continuing reference to FIG. 1, according to one aspect the NMOS switch circuit 14 may have its switch FETs and dummy FETs arranged in a fashion substantially mirroring the above-described arrangement of the PMOS switch FETs and PMOS dummy FETs within the PMOS switch circuit 12. More particularly, the source of the NMOS switch FET N1 may face toward the circuit 14 input node AN and the source of the parallel branch NMOS switch FET N2 may face toward the circuit 14 output node BN. The sources of the NMOS dummy FETs N3 and N4 may each connect directly to the source of their corresponding NMOS switch FETs N1 and N2. As further described in the additional detailed description below, the NMOS dummy FET N3 between the input node AN and the source of the NMOS switch FET N1 provides for the dummy FET N3 to be controlled, by clock and bias sequencing features of the various embodiments, to inject canceling charges into the input node AN. Likewise, the dummy FET N4 being between the source of the NMOS switch FET N2 and the circuit 14 output node BN allows that dummy FET N4, under control of the clocking and FET body bias sequence aspects of various embodiments, to inject canceling charges into the output node BN and, thus, the into holding capacitor Cs.

Continuing to refer to FIG. 1, according to one aspect the PMOS switch circuit 12 may have a respective transistor body bias sequencing circuit 20 for applying a particular sequence of PMOS body bias voltages to each of the PMOS switch FETs, such as P1 and P2, and a generally complementary PMOS body bias voltage to each of the PMOS dummy FETs, such as P3 and P4, as described in greater detail in later sections of this disclosure.

With continuing reference to FIG. 1, according to one aspect the NMOS circuit 14 may have a respective transistor body bias sequencing circuit 22 for applying a particular sequence of NMOS body bias voltages to each of the NMOS switch FETs, e.g., N1 and N2, and a generally complementary bias voltage to the NMOS dummy FETs, e.g., N3 and N4 as described in greater detail below.

Continuing to refer to FIG. 1, in the practice of S/H switch circuits having one or more of the FET body sequencing aspects of the various embodiments, it is preferable that each of the FETs having a switched body bias has a corresponding body connection for better imparting the bias voltage. For example, in the FIG. 1 example 10, each of the PMOS FETs P1 through P4 of the PMOS switch circuit 12 may have a corresponding body bias connection, such as the connections labeled in FIG. 1 as "b_P1," "b_P2," "b_P3," and "b_P4." Similarly, in the FIG. 1 example 10 each of the NMOS FETs N1 through N4 of the NMOS switch circuit 14 may have a corresponding body bias connection, such as the connections labeled "b_N1," "b_N2," "b_N3," and "b_N4." Regarding implementation, the body connections b_P1-b_P4 of the PMOS circuit switch 12 may be implemented by, for example, an N+ implantation in each of the respective N-wells forming the bodies of the FETs P1 through P4. Similarly, body connections such as the example b_N1 through b_N4 for the NMOS FETs N1-N4 of the NMOS circuit switch 14 may be implemented by, for example, a P+ implantation in the P-well body of each of these NMOS FETs. Illustrative examples of such implantations to form the body connections are described in greater detail below in reference to FIGS. 4A and 4B.

FIG. 1 shows one example functional block diagram of one implementation of a PMOS FET body bias sequencer 20, representing its operations in terms of logical ON-OFF switches SW1 through SW4, each shown as controlled by an external sample-and-hold CLK or its inverse NCLK according to the truth table that is indicated by the position of the switch. For example, the depicted switch SW1 is defined in terms of the CLK signal as being open when the CLK is at $V_{DD}$ and, therefore, closed when the CLK is GND.

It will be understood that the FIG. 1 depicted logical definition of the PMOS bias sequencing circuit 20, as well as the depicted logical definition of the NMOS bias sequencing circuit 22, are merely example logical descriptions and not necessarily circuit specifications. Further, it will be understood that the FIG. 1 depiction of the PMOS FET body bias sequencer 20 and the NMOS FET body bias sequencer 22 receiving separate CLK and NCLK signals is only one example implementation. An alternative implementation is reception of only a CLK signal, and configuring the components implementing the sequencers 20 and 22 to generate, using only the CLK signal, the same voltages to the bodies b_P1-b_P4 and b_N1-b_N4 as generated by the depicted FIG. 1 arrangement of switches SW1-SW4 and switches SW5-SW8 controlled by CLK and NCLK. A person of ordinary skill in the art, however, will understand that the FIG. 1 depiction of switches SW1-SW4 controlled by CLK and NCLK may exploit and benefit from a synchronous timing between a particularly generated CLK and NCLK as is described in greater detail at later sections of this disclosure. Such persons will understand that alternative implementations of the PMOS FET body bias sequencer 20 and NMOS FET body bias sequencer 22 may require consideration of timing issues in their respective generation of bias voltages to the FETs.

Continuing to refer to FIG. 1, it will be understood that the depicted location of each of the FET body bias sequencers 20 and 22, and the separation of their respective functions into two blocks (i.e., blocks 20 and 22), as well as the location of the switches SW1-SW4 within sequencer block 20, and SW5-SW8 within sequencer block 22, may be unrelated to a physical location of their respective components.

The FIG. 1 example 10 shows one illustrative example circuit for distributing the bias body voltages from the PMOS FET body bias sequencer 20 to the FETs of the PMOS switch circuit 12. The example 10 also shows one example circuit for distributing the body bias voltages from the NMOS FET body bias sequencer 22 to the NMOS switch circuit 14 FETs. One illustrative example for distributing the PMOS body bias voltages includes a PMOS switch body bias supply line 28 extending from the PMOS bias sequencer 20 to the P1 and P2 PMOS switch FET body connections b_P1 and b_P2, and a PMOS dummy bias node 30 extending from the sequencer 20 to the body connections b_P3 and b_P4 of the PMOS dummy FETs P3 and P4. Similarly, one illustrative example for distributing the NMOS body bias voltages includes an NMOS switch body bias supply line 32 extending from the sequencer 22 to the body connections b_N1 and b_N2 of the NMOS switch FETs N1 and N2, and an NMOS dummy bias line 34 extending from the sequencer 22 to the NMOS dummy FET body connections b_N3 and b_N4.

Before describing the internal switch operations of the example SW1-SW4 and SW5-SW8, the overall bias sequence applied to P1-P4 by the PMOS bias sequencer 20 and to N1-N4 by the NMOS bias sequencer 22 will be described.

First, in the FIG. 1 example 10, the sampling mode is when the CLK, which connects to the gates of the PMOS switch FETs P1 and P2 (as well as the NMOS dummy FETs N3 and N4) is at GND and the NCLK, which connects to the gate of the NMOS switch FETs N1 and N2 (as well as the PMOS dummy FETs P3 and P4) is at $V_{DD}$. The PMOS switch FETs P1 and P2, and the NMOS switch FETs N1 and N2 are therefore ON, and the Signal_IN is thereby connected to the output node B through four parallel paths to charge the capacitor Cs. During this sampling mode, the PMOS body bias sequencer 20 biases the bodies of the PMOS switch FETs P1 and P2 to the input signal voltage, Signal_IN and, likewise, the NMOS body bias sequencer 22 biases the bodies of the NMOS switch FETs N1 and N2 to the same Signal_IN voltage. This biasing reduces the ON resistance of both the PMOS switch FETs P1 and P2 and the NMOS switch FETs N1 and N2. With respect to the dummy FETs, during the sampling mode the PMOS sequencer 20 reverse biases the bodies of the PMOS dummy FETs P3 and P4 to $V_{DD}$ and the NMOS sequencer 22 biases the bodies of the NMOS dummy FETs to GND. A purpose of this reverse biasing is to form a depletion region under the gates of PMOS dummy FETs P3 and P4 and under the gates of the NMOS dummy FETs N3 and N4. The depletion region functions, in turn, to increase the amount of charge required to form a conducting channel under the gates of the dummy FETs when the CLK and NCLK switch the circuit 10 to the hold mode, as described in greater detail in later sections.

With respect to the PMOS switch circuit 12, a target of the biasing sequence applied by the PMOS bias sequencer 20 in conjunction with a substantially identical structure of the PMOS FETs P1, P2, P3 and P4, as also described in greater detail in later sections, is to match the charge required to form the conducting channels under the gates of the PMOS dummy FETs P3 and P4 to the total P charge that must be expelled from the source and the drain of the PMOS switch FETs P1 and P2 when switching these from the sampling mode to the hold mode. As will be described in greater detail below, the total expelled charge is the channel charge added to the charge expelled to form the depletion region. Among other features and benefits, this will cancel a charge injection exhibited by the PMOS switch FETs P1 and P2 when switching from the sampling mode to the hold mode. In the same manner, and as also described in greater detail in later sections, a target of the biasing sequence applied by the NMOS bias sequencer 22 with respect to the NMOS circuit switch 14 is to match the charge required to form the conducting channels under the gates of the NMOS dummy FETs N3 and N4 to the total N charge that must be expelled from the source and the drain of the NMOS switch FETs N1 and N2 when switching these from the sampling mode to the hold mode.

Continuing with the description of a biasing applied by the PMOS and NMOS bias sequencers 20 and 22, when the CLK and NCLK switch to the hold mode the PMOS switch FETs P1 and P2 are turned off by the CLK, and the NMOS switch FETs N1 and N2 are turned off by the NCLK. To even further turn off these switch FETs, during the hold mode the PMOS FET body bias sequencer 20 applies a Vim reverse bias to the bodies of the PMOS switch FETs P1 and P2, and the NMOS FET body bias sequencer 22 applies a GND reverse bias to the bodies of the NMOS switch FETs N1 and N2. This further isolates the input node A from the output node B. Concurrently, when the clocks CLK and NCLK switch from the sampling mode to the hold mode, the PMOS FET body bias sequencer 20 biases the bodies of the PMOS dummy FETs P3 and P4 to the output voltage on the node B and, likewise, the NMOS FET body bias sequencer 22 biases the bodies of the NMOS dummy FETs N3 and N4 to the output voltage. The purpose of this biasing of the dummy FETs is to form a conducting channel under their respective gates, for performing charge injection cancelling functions that are described in greater detail in later sections.

With continuing reference to FIG. 1, the example PMOS bias sequencer circuit 20 may be implemented by a switching circuit topology represented as a stack of an ON-OFF switch SW1 and ON-OFF switch SW3. In the depicted example 10, since the CLK is connected to the gates of the PMOS switch circuit PMOS switch FETs P1 and P2, the sampling mode is when the CLK is at GND and NCLK is at $V_{DD}$. SW1 is therefore ON, or closed and SW3 is therefore OFF, or open. As result, through the example topology of switches SW1 and SW3 depicted in the FIG. 1 example PMOS bias sequencer circuit 20, in the sampling mode when PMOS switch FETs P1 and P2 are ON their respective body connections b_P1 and b_P2 are connected to the input node A, thereby biasing these to the Signal_IN voltage.

Continuing to refer to the FIG. 1, in particular to the PMOS bias sequencer circuit 20 during the sampling mode, with respect to the PMOS dummy FETs P3 and P4. According to the depicted truth table of the example switches SW2 and SW4, during the sampling mode SW4 is ON, or closed, and SW2 is OFF, or open. The switch SW4 therefore connects the PMOS dummy FET bias line 30 to the $V_{DD}$ rail, reverse biasing the PMOS dummy FETs P3 and P4.

Continuing to refer to FIG. 1, in the NMOS switch circuit 14 during the sampling mode the example NMOS bias sequencer circuit 22 operates in substantially the same manner to bias the bodies of the NMOS switch FETs N1 and N2 to the Signal_IN voltage on the input node A. More particularly, with respect to the NMOS switch FETs N1 and N2, in the sampling mode the CLK is at GND and NCLK is at $V_{DD}$ and, therefore, SW5 is ON and SW7 is OFF. The switch SW5 therefore connects the NMOS switch circuit 14 input AN (which is directly connected to the overall input node A) to the NMOS switch FET bias line 32, which biases the bodies of the NMOS switch FETs N1 and N2 to the Signal_IN at the input mode A. As previously described, this lowers the ON resistance of the NMOS switch FETS N1 and N2, thereby facilitating the charging of the hold capacitor Cs.

With respect to the NMOS dummy FETs N3 and NA during the sampling mode, according to the depicted truth table of the example switches SW6 and SW8, during the sample mode SW6 is OFF, or open, and SW8 is ON, or closes. The switch SW8 therefore connects the NMOS dummy FET bias line 34 to GND, reverse biasing the NMOS dummy FETs N3 and N4.

Preferably, for reasons that are readily understood from the further detailed description in later sections, the geometry, the performance-related dimensions and the physical implementation orientation of the PMOS dummy FETs P3 and P4 are identical, or substantially identical, to the geometry, the performance-related dimensions and the physical implementation orientation of their corresponding PMOS switch FETs P1 and P2. For substantially the same reasons, the geometry, the performance-related dimensions and the physical implementation orientation of the NMOS dummy FETs N3 and N4 are identical, or substantially identical, to the geometry, the performance-related dimensions and the physical implementation orientation of their corresponding NMOS switch FETs N1 and N2.

Referring to FIG. 1, this preferable structural relation is represented by all of the PMOS FETs P1 through P4 being labeled with the same "Wp/Lp" label, and all of the NMOS FETs N1 through N4 being labeled with the same "Wn/Ln," where "Wp/Lp" and "Wn/Ln" represents "width" and "length" of the PMOS and NMOS structures, respectively, as these terms are used in the FET arts relevant to these embodiments. As far as the meaning of "identical," it will be understood that numeric ranges and particular physical parameters are application-dependent, and that persons of ordinary skill in the arts pertaining to S/H circuits, applying ordinary know-how and ordinary standards of engineering practice to the present disclosure, can readily and sufficiently identify specific tolerances, numeric ranges and the like to meet the application.

An example method according to one embodiment, using illustrative operations described as performed on the FIG. 1 example 10 for purposes of reference, will be described. Persons of ordinary skill in the arts pertaining to S/H circuits will, upon reading this disclosure in its entirety, have an understanding of its concepts and related advances in compensating both the charge injection effect and the clock feedthrough effect, sufficient to further practice apparatuses and methods according to one or more of the embodiments.

First, a characteristic of a turned-on MOS switch FET, such as the PMOS switch FETs P1 and P2, and the NMOS switch FETs N1 and N2, is that a conductive channel exists underneath the gate. For the PMOS FETs, the conductive channel is formed by a gate-to-body voltage low enough to collect positive (P) charges from the N-well to form a high concentration layer (i.e., channel) of P charges at the surface of the N-well facing the gate. This leaves a depletion area at the interface between the channel and the N-well. For the NMOS FETs the conductive channel is formed by a gate-to-body voltage high enough to collect negative (N) charges from the P-well and form a high concentration layer (i.e., channel) of N charges at the surface of the P-well facing the gate. This leaves a depletion area at the interface between the channel and the P-well.

Referring to the PMOS switch FETs P1 and P2, when the gate voltage of these FETs is raised from GND to $V_{DD}$ the electric field maintaining the above-described conducting channel of P charges and the depletion region ceases. This, of course, switches the PMOS switch FET from ON to OFF. Concurrently, because the electric field maintaining the conducting channel has ceased, the P charges that formed the conducting channel must go somewhere. Some of these P charges may dissipate to the N-well. However, various factors including, in particular, the above-described depletion region with the same electric field polarity as the charge in the channel prevent much of the positive charges stored in the channel from migrating back into the N-well and, instead, a substantial portion of these P charges are expelled through the source and the drain.

Referring now to the NMOS switch FETs N1 and N2, a similar charge expelling occurs when these are switched from ON to OFF. More particularly, when the gate voltage of these NMOS FETs drops from $V_{DD}$ to GND the electric field maintaining the above-described conducting channel of N charges and the depletion region ceases and, therefore, the N charges that formed that conducting channel must dissipate. Some of these N charges will dissipate into the P-well, but the above-described depletion region with the same electric field polarity as the charge in the channel prevent a substantial quantity of the N charges stored in the channel from migrating back into the P-well. Instead, a substantial portion of these N charges are exuded through the source and the drain of the NMOS switch FETs N1 and N2.

It may be theoretically possible that, concurrent with the CLK and NCLK changing from the sampling mode to the hold mode, and thus concurrent switching the PMOS switch FETs P1 and P2 and the NMOS switch FETs N1 and N2 OFF, that the N charges expelled from the source and the drain of the NMOS switch FETs N1 and N2 will exactly equal, in magnitude and timing, the P charges expelled from the source and the drain of the PMOS switch FETs P1 and P2. However, such is generally not the case. One reason is that a PMOS device width may be at least twice the width of an NMOS device and, therefore, its conducting channel P charge may be at least twice as large as the conducting channel N charge of an NMOS device. Therefore, referring to the FIG. 1 example 10, when the charge injections from the branch input nodes AN and AP are summed at the input mode A, and the charge injection from the branch output nodes BN and BP are summed, the result is a short duration, substantial net charge injection to the input node A and to the output node B occurs. With respect to the input node A, this short duration charge injection introduces an over-shoot voltage. The settling time of this over-shoot voltage is decided by the voltage level and the sourcing and draining current capability of the input signal source. More importantly, with respect to output node B, the short duration charge injection introduces a signal dependent offset which may be a significant source of nonlinearity errors. This nonlinearity error is called the "channel charge injection effect."

Among the features and benefits provided by the PMOS dummy FETs P3 and P4, and the NMOS dummy FETs N3 and N4, in the FIG. 1 arrangement described previously, and respectively biased by, for example, the PMOS sequencer circuit 20 and the NMOS sequencer circuit 22, is a canceling of the channel charge injection effect with respect to each of the PMOS switch circuit 12 and the NMOS circuit 14.

Referring now to the FIG. 1 example 10, during the sampling mode (i.e., when the CLK is at GND) the PMOS switch FETs P1 and P2 are ON. As previously described, conductive P channels are therefore formed under the gates of these PMOS FETs P1 and P2. The total charge in each PMOS channel, designated as "Qsp", is determined by the dimension of the device, the gate-to-source voltage difference $V_{GSP}$ ($V_{GSP}=V_{GP}-V_{SP}$) and the threshold voltage "$V_{THP}$". The $V_{THP}$ voltage is a function of the work function between the gate material and the bulk silicon in the channel region, the Fermi potential, the depletion-layer charge, the positive charge due to impurities and imperfections at the interface, the gate capacitance and the source-to-body bias ($V_{SBP}$). The $V_{SBP}$ may be zero in circuits according to the embodiments because, as described above in reference to the PMOS FET body bias sequence circuit 20, during the sampling mode the input node A may be connected to the body bias connections b_P1 and b_P2 of the PMOS switch FETs P1 and P2.

Likewise, with respect to the NMOS switch FETs N1 and N2, during the sampling mode (i.e., when the NCLK is at $V_{DD}$) the NMOS switch FETs N1 and N2 are ON. Conductive N channels are therefore formed under the gates of the NMOS FETs N1 and N2. The total charge in each NMOS channel is designated as "Qsn" and, similar to the "Qsp" of the PMOS channel, is determined by the dimension of the device, the gate-to-source voltage difference $V_{GSN}$ ($V_{GSN}=V_{GN}-V_{SN}$) and the threshold voltage "$V_{THN}$". The $V_{THN}$ voltage is a function of the work function between the gate material and the bulk silicon in the channel region, the Fermi potential, the depletion-layer charge, the negative charge due to impurities and imperfections at the interface, the gate capacitance and the source-to-body bias ($V_{SBN}$). Like $V_{SBP}$ of the PMOS switch FETs P1 and P2, $V_{SBN}$ of the NMOS switch FETs N1 and N2 may be zero in circuits according to the embodiments because, as described above in reference to the NMOS FET body bias sequence circuit 22, during the sampling mode the input node A may be connected to the body bias connections b_N1 and b_N2 of the NMOS switch FETs N1 and N2.

Continuing to refer to the FIG. 1 example 10, also during the sampling mode the PMOS dummy FETs P3 and P4 are switched OFF, because the NCLK connected to their gates is $V_{DD}$. The body connections b_P3 and b_P4 of the PMOS dummy FETs P3 and P4 as described above, are also reverse biased by the $V_{DD}$ supply potential. The reverse bias causes a reversed bias p-n junction in each of P3 and P4 and, therefore creates a depletion region around their respective source and drain areas. The charge, arbitrarily labeled herein as "Qhp," that was extant in the N-well (later on called the depletion region) of the dummy PMOS FETs P3 and P4 at the rising edge of NCLK dissipated within a short interval after that edge. Because of the depletion region formed by the reverse biasing of the bodies of FETs P3 and P4, the charge Qhp is exuded out of the source and the drain of each of the dummy PMOS FETs P3 and P4 and then distributed between the signal source providing input signal to the input node A and Cs. However, this charge injection by the PMOS dummy FETs P3 and P4 has no substantial effect. The reason is that, since in the sampling mode there is a DC path from the output node B to the signal source due to the PMOS switch FETs P1 and P2 ON, the sampled voltage on the sampling capacitor Cs is eventually forced to the value same as Signal_IN, not determined by charge Qhp.

Also during the sample mode the NMOS dummy FETs N3 and N4 are switched OFF, as the CLK connected to their respective gates is at GND. The switching OFF of the NMOS dummy FETs N3 and N4 causes a charge injection substantially of the same general type as described above with respect to the PMOS dummy FETs P3 and P4, except that it is an opposite charge polarity. The charge is arbitrarily labeled herein as "Qhn". This charge injection, for substantially the same reasons as described above in reference to the PMOS dummy FETs P3 and P4 (i.e., because the NMOS switch FETs N1 and N2 are ON, creating a DC path between the input node A and output node B), has no appreciable effect.

With continuing reference to FIG. 1, the circuit 10 changes to a hold mode when the CLK changes from GND to $V_{DD}$ and, concurrently, the NCLK changes from $V_{DD}$ to GND isolating the input node A from the output node B. More particularly, the CLK connected to the gates of the PMOS switch FETs P1 and P2 going to $V_{DD}$ switches these FETs OFF, and the NCLK connected to the gates of the NMOS switch FETs N1 and N2 switches these FETs OFF. Then, as described previously, the channels formed in each of the PMOS switch FETs P1 and P2, and the channels formed in each of the NMOS switch FETs N1 and N3 then disappear.

The charge "Qsp" in each channel of the PMOS switch FETs P1 and P2 is then expelled to the circuit 12 input node AP and to the circuit 12 output node BP. Likewise, the charge "Qsn" in each channel of the NMOS switch FETs N1 and N2 is concurrently expelled to the circuit 14 input node AN and the circuit 14 output node BN.

Referring to the PMOS circuit 12, concurrently with the sampling to hold transition resulting from CLK changing to $V_{DD}$, the switches SW1 and SW3 connect $V_{DD}$ to the bias line 28 and, hence to the body connections b_P1 and b_P2, setting $V_{SBP}$ to a negative voltage $V_{SP}-V_{DD}$. This reverse biasing is the same as described above for the PMOS dummy FETs P3 and P4 during the sampling mode, and creates a depletion region under the P1 and P2 gates. Likewise, at the sampling to hold transition NCLK changes from $V_{DD}$ to GND, and the switches SW5 and SW7 switch in turn to connect GND to the NMOS switch FET bias line 32 and, hence to the body connections b_N1 and b_N2, setting $V_{SBN}$ to a positive voltage $V_{SN}$–GND. This reverse biasing is the same as described above for the NMOS dummy FETs N3 and N4 during the sampling mode, and creates a depletion region under the N1 and N2 gates.

As previously stated, according to one aspect it is preferable that the physical dimensions, geometry and other parameter values of the PMOS FETs P1 and P2 are the same as the corresponding physical dimensions, geometry and other parameters of the PMOS dummy FETs P3 and P4. Likewise, according to one aspect it is preferable that the physical dimensions, geometry and other parameter values of the NMOS FETs N1 and N2 are the same as the corresponding physical dimensions, geometry and other parameters of the NMOS dummy FETs N3 and N4.

Assuming the PMOS FETs P1 through P4 are fabricated as such, the charge expelled from the newly generated depletion region in the PMOS switch FETs P1 and P2 (caused by the above-described reverse biasing) is equal to the charge Qhp expelled from the PMOS dummy FETs P3 and P4 when forming the depletion region in these FETs. Assuming the NMOS FETs N1 through N4 are fabricated to have identical dimensions and structure then, for the same reason, charge expelled from the newly generated depletion region in the NMOS switch FETs N1 and N2 is equal to the charge Qhn expelled from the NMOS dummy FETs N3 and N4 when forming their depletion region in switching to the sampling mode. Therefore, with respect to the PMOS switch circuit 12, when CLK and NCLK switch from the sampling to the hold mode, the total charge expelled from the sources and drains of the PMOS switch FETs P1 and P2 to the circuit 12 input node AP and output node BP is: (Qsp+Qhp). Concurrently, the total charge expelled from the sources and drains of the NMOS switch FETs N1 and N2 to the circuit 14 input node AN and output node BN is: (Qsn+Qhn).

Various concepts and example operations of charge injection cancelling features provided by a PMOS switch circuit such as the depicted example 12, according to one or more embodiments will now be described, followed by description of similar concepts and example operations of charge cancelling features provided by an NMOS switch circuit such as the FIG. 1 example 14.

Referring to the FIG. 1 example PMOS switch circuit 12, concurrent with the switching OFF of the PMOS FETs P1 and P2, the PMOS dummy FETs P3 and P4 are switched ON, from the reverse biased depletion state to the ON state, because NCLK feeding the gates of P3 and P4 goes to GND. The switches SW2 and SW4 also change, under control of the NCLK and CLK, to bias the bodies of P3 and P4 to the voltage on the output node B, where is the sampled signal stored in the Cs capacitor. As a result, a channel of P charges is built up under the gates of P3 and P4. Because the PMOS dummy FETs P3 and P4 switched from a reverse-biased depletion state to an ON state, the total charge QtotalP required to build the channel is not just the channel charge Qsp. The total charge QtotalP is, instead, equal to (Qhp+Qsp), where Qhp is the charge required to fill in the depletion region that was extant in the PMOS dummy transistors P3 and P4 by reverse biasing these in the sampling mode, and Qsp is the charge to build the channel of P charges.

As will be understood by persons of ordinary skill in the relevant arts, since the physical parameters of the PMOS dummy FETs P3 and P4 are matched to those of the PMOS signal switch FETs P1 and P2, further to the above-described biasing sequence and described structure, when the circuit 10 switches from the sampling mode to the hold mode the total charge absorbed by the PMOS dummy FETs P3 and P4 in forming their respective conducting channels, namely Qsp+Qhp, exactly equals the above-described total charge injected from the channel and the depletion region of the PMOS signal switch FETs P1 and P2 in extinguishing their conducting channels and forming their depletion region.

The above-described charge injection effect cancellation is also provided by the NMOS switch circuit 14.

Referring to the FIG. 1 example NMOS switch circuit 14, concurrent with the switching OFF of the NMOS FETs N1 and N2, the NMOS dummy FETs N3 and N4 are switched ON, from the reverse biased depletion state to the ON state, because CLK feeding the gates of N3 and N4 switches from GND to $V_{DD}$. The switches SW6 and SW8 also change, under control of the NCLK and CLK, to bias the bodies of N3 and N4 to the voltage on the output node B, where is the sampled signal stored in the Cs capacitor. The result is that a channel of N charges is built up under the gates of N3 and N4. Because, in forming this channel, the NMOS dummy FETs N3 and N4 switched from a reverse-biased depletion state to an ON state, the total charge QtotalN required to build the channel is the channel charge Qsn added to the charge Qhn of N charges required to fill in the depletion region formed in the NMOS dummy transistors N3 and N4 by reverse biasing these in the sampling mode.

Assuming the physical parameters of the NMOS dummy FETs N3 and N4 are matched to those of the NMOS signal switch FETs N1 and N2 then, combined with the above-described NMOS biasing sequence, when the circuit 10 switches from the sampling mode to the hold mode the total charge absorbed by the NMOS dummy FETs N3 and N4 in forming their respective conducting channels, which is Qsn+Qhn, exactly equals the above-described total charge injected from the channel and the depletion region of the NMOS signal switch FETs N1 and N2, in extinguishing these conducting channels and depletion regions.

It is therefore readily understood that PMOS-NMOS S/H feed circuits according to various of the disclosed embodiments, such as the depicted FIG. 1 example 10, and various alternative implementations provide full compensation for, and substantial elimination of, the "channel charge injection effect" exhibited by related art of the PMOS-NMOS S/H feed circuits.

A clock feedthrough effect cancellation within sample-and-hold circuits according to the FIG. 1 example 10, and provided by S/H operations and methods performed on S/H circuits according to the embodiments, will now be described. To expedite an understanding of the relevant concepts sufficient to practice according to the various disclosed embodiments, a clock feedthrough effect cancellation will be first described with respect to the PMOS switch circuit 12. As will be readily understood by persons of ordinary skill in the art, operations and concepts described in reference to the PMOS switch circuit 12 may be applied, by such persons upon reading this entire disclosure, to the practice of a clock feedthrough cancellation on an NMOS switching circuit such as the example 14.

Referring to FIG. 1, in particular to the example PMOS switch circuit 12, absent. PMOS dummy FETs such as FETs P3 and P4 of the depicted example, one type of clock feedthrough results from the voltage variation of the CLK changing states (i.e., the CLK edges) being coupled to the sampling capacitor Cs and to the input node A through the gate-to-source/gate-to-drain parasitic capacitors of the PMOS switch FETs P1 and P2. Referring to the exploded view 100 of the FIG. 1 PMOS switch FET P1, these parasitic capacitances are shown and are labeled modeled elements "Cgsp" and "Cgdp." It will be understood that the relation of "Cgsp" and "Cgdp" with respect to coupling between the gates of P1 and P2 and the input and output nodes A and B are reversed since, in the FIG. 1 example 10, the PMOS switch FET P1 has its source connected to the input node AP (which is directly connected to the input node A), while the PMOS switch FET P2 has its drain connected to the input node AP. Similarly, the drain of the PMOS switch FET P1 is connected to the output node BP (which is directly connected to the input node B), while the source of the PMOS switch FET P2 is connected to the output node BP.

As previously described, using the clock convention of the FIG. 1 example the sampling to hold transition occurs when the CLK signal toggles from GND to $V_{DD}$. The voltage variation $V_{DD}$ of the CLK is then coupled to the output node B via the parasitic capacitor "Cgdp" of the PMOS switch FET P1, and via the "Cgsp" of the parallel PMOS switch FET P2, and is then redistributed among them and the hold capacitor Cs. Absent an arrangement of dummy FETs or equivalents such as the PMOS dummy FETs P3 and P4, having gates switching complementary to the gate switching at the PMOS switch FETs P1 and P2, the above-described coupling generates an offset that may be termed as $+V_{OFF\_SW}$.

In addition, at the sampling to hold transition when the CLK signal toggles from GND to $V_{DD}$ the voltage variation $V_{DD}$ of the CLK is also coupled to the input node A via the parasitic capacitor "Cgsp" of the PMOS switch FET P1, and via the "Cgdp" of the PMOS switch FET P2. As can be understood by a person of ordinary skill in the art, this coupling introduces a positive glitch at the input node A.

Referring now to the PMOS dummy FETs P3 and P4, concurrent with the above-described toggling of the CLK signal from GND to $V_{DD}$ when switching from the sampling mode to the hold mode, the NCLK connected to the gates of the PMOS dummy FETs P3 and P4 toggles from $V_{on}$ to GND. The PMOS dummy FETs P3 and P4 being, according to one preferred embodiment, structurally substantially identical to the PMOS signal switch FETs P1 and P2 have the substantially the same "Cgsp" and "Cgdp" values as the PMOS switch FETs P1 and P2. Further, the source and the drain of each of the PMOS dummy FETs P3 and P4 are connected together. Therefore, referring to the PMOS dummy FET P4, at the sample-to-hold transition the falling edge of the NCLK voltage at the gate of that FET P4, which is equal to $-V_{DD}$, is coupled to the output node B through the FETs parasitic capacitors "Cgsp" and "Cgdp", and then shared between them and the Cs holding capacitor. This generates another offset, which may be arbitrarily labeled as "$-V_{OFF\_DUMMY}$". Similarly, referring to the PMOS dummy FET P3, when the NCLK connected to its gate toggles from $V_{DD}$ to GND, the voltage variation is coupled, via "Cgsp" and "Cgdp" of the FET P3, and goes to the input node A, introducing a negative glitch.

As described above, according to various embodiments the PMOS switch FETs P1 and P2, and the PMOS dummy FETs P3 and P4 may be structured and arranged in physical relation to one another, such that "Cgsp" and "Cgdp" of these PMOS FETs are mutually equal.

Therefore, the sum of "$+V_{OFF\_SW}$" and "$-V_{OFF\_DUMMY}$" may be zero and, accordingly, both of the following benefits and features are provided: the offset on Cs may be cancelled, and the glitch may be eliminated, or reduced at least to the level constrained by the process mismatch between the PMOS switch FETs P1 and P2 and the PMOS dummy FETs P3 and P4.

The above-described clock feedthrough cancellation concepts are readily applied to the NMOS switch circuit 14, to provide substantially the same clock feedthrough effect cancellation. More particularly, this is obtained by the depicted complementary clocking of the NMOS switch FETs N1 and N2 (which receive NCLK), and the NMOS dummy FETs N3 and N4 (which receive CLK) and by configuring and fabricating the NMOS switch FETs N1 and N2, and the NMOS dummy FETs N3 and N4 to have substantially the same gate-to-source and gate-to-drain coupling capacitance. Such configuring and fabricating is readily performed by persons of ordinary skill in the art upon reading this disclosure.

Figure 2:
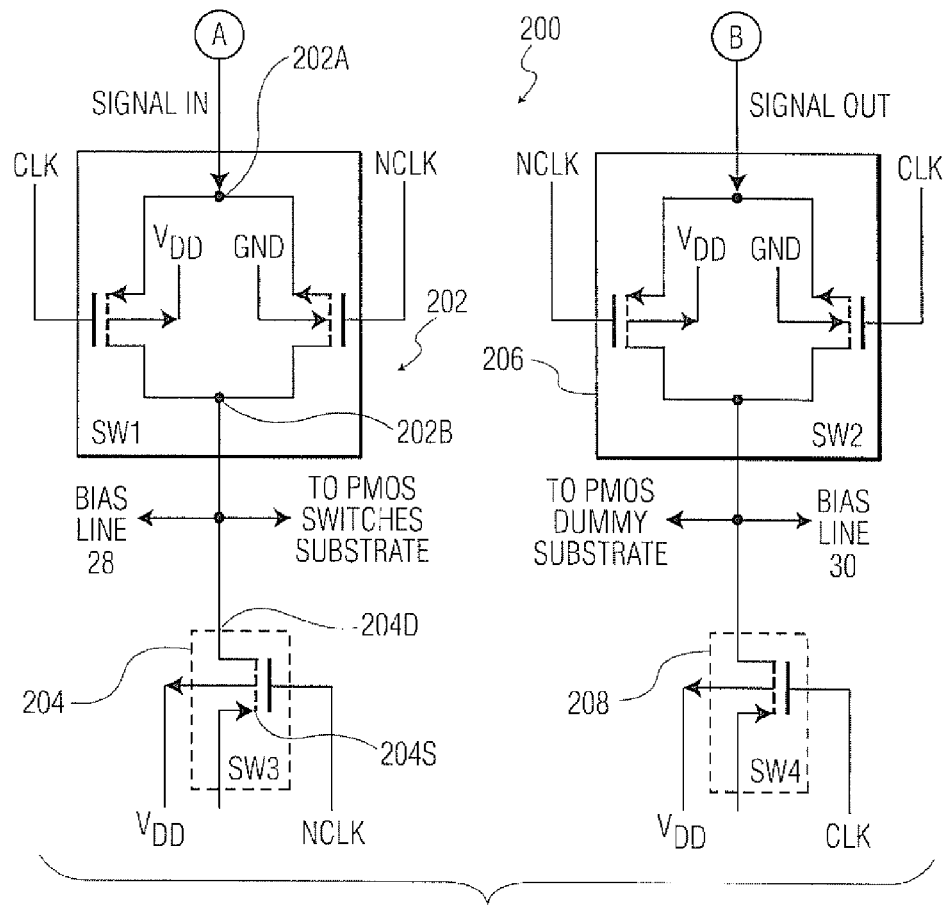
FIG. 2 is a circuit block diagram representation of one example complementary transistor body bias sequencing circuit configured to apply, under control of a sample-and-hold clock and an inverted sample-and-hold clock, a sequenced switching of biases to the bodies of the PMOS switch and dummy FETs of an example NMOS-PMOS S/H according to one or more embodiments.

FIG. 2 shows one example configuration 200 that may implement the PMOS bias sequencer circuit 20 in the FIG. 1 example circuit 10.

Referring to FIG. 2, in an example implementation of the SW1-SW3 switch pair, the example 200 includes a stacked arrangement of a CMOS switch 202 and a PMOS FET switch 204 to generate the bias voltage connecting to the PMOS switch FET bias line 28 which connects (as shown in FIG. 1) to the body connections b_P1 and b_P2 of the PMOS switch FETs P1 and P2. In the stacked arrangement of 202 and 204, the end 202A of the CMOS switch 202 may be connected to the FIG. 1 input node A (not shown n FIG. 2), the other end 202B may be connected to the drain 204D of the PMOS FET 204, and the source 204S of the PMOS FET 204 may be connected to $V_{DD}$. The depicted connection between the end 202B of the CMOS switch 202 and the drain 204D of the PMOS FET 204 may connect to the PMOS switch FET bias line 28 shown in FIG. 1. As can be seen in FIG. 2, when CLK is ON (which is GND) the CMOS switch 202 is ON and, since NCLK is OFF, the PMOS FET switch 204 is OFF. The PMOS switch FET bias line 28 is therefore connected to the input node A, to receive the Signal_IN. When the CLK is OFF and the NCLK is ON, the states of 202 and 204 are reversed and the PMOS switch FET bias line 28 is connected through the PMOS FET switch 204 to Vim.

Continuing to refer to FIG. 2, the example 200 may also implement the SW2-SW4 switch pair with a stacked arrangement of a CMOS switch 206 and a PMOS FET switch 208 to generate the bias voltage connecting to the PMOS dummy FET bias line 30 feeding the body connections b_P3 and b_P4 of the PMOS dummy FETs P3 and P4. The operation is similar to the above-described operation of the stacked arrangement of the CMOS switch 202 and the PMOS FET switch 204. When the NCLK is at GND the CMOS switch 206 is ON and, since CLK is OFF, the PMOS FET switch 208 is OFF. The PMOS dummy FET bias line 30 is therefore connected to the output node B, to receive the signal stored on the sampling capacitor Cs. When the NCLK is OFF and the CLK is ON, the states of 206 and 208 are reversed and the PMOS dummy FET bias line 30 is connected through the PMOS FET switch 208 to $V_{DD}$.

It will be understood that FIG. 2 shows a circuit functional block diagram, and may not be representative of a preferred physical arrangement of the switches SW1 through SW4 in relation to the PMOS switch FETs P1 and P2 and/or the PMOS dummy FETs P3 and P4.

According to one aspect of one or more embodiments, the following physical arrangement of components forming the FIG. 2 example 200, in relation to components forming a S/H feed circuit having an embodiment as depicted at FIG. 1 may be preferable: the CMOS switch 202 implementation of SW1 may preferably be located between the bodies of the PMOS switch FETs P1 and P2 and the input node A; the PMOS switch 204 implementation of SW3 may preferably be located between the bodies of the PMOS switch FETs P1 and P2 and the $V_{DD}$ supply; the CMOS switch 206 implementation of SW2 may preferably be located between the bodies of the PMOS dummy FETs P3 and P4 and the output node B; and the PMOS FET 208 implementation of SW4 may preferably be located between the bodies of the PMOS dummy FETs P3 and P4 and the supply rail $V_{DD}$.

Continuing to refer to FIG. 2, bodies of the PMOS devices used in the example switching network 200 may be biased by the $V_{DD}$ supply potential and the bodies of the NMOS devices (not separately numbered) within the CMOS switches 202 and 206 may be biased by the GND potential.

Figure 3:
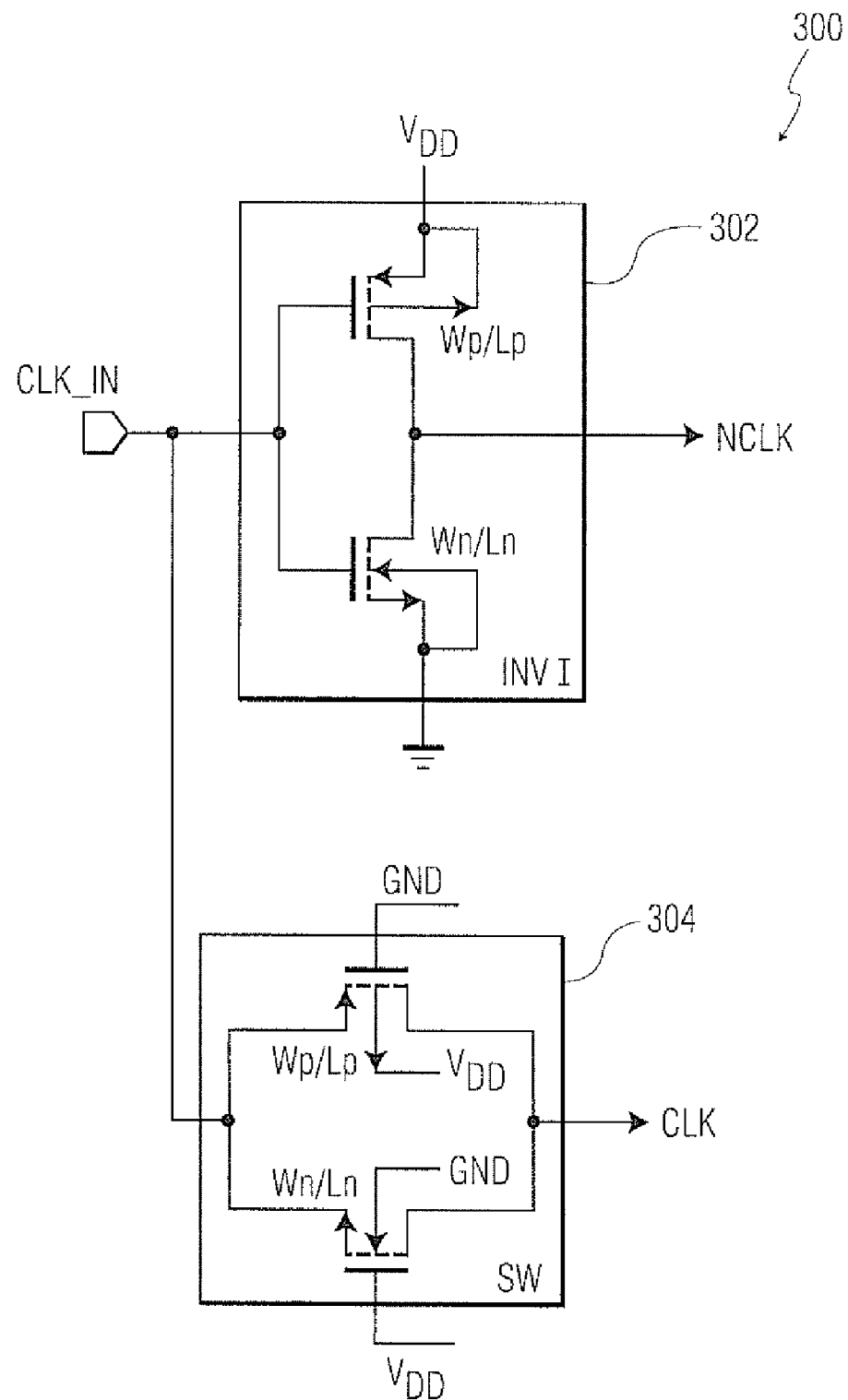
FIG. 3 is a circuit diagram representation of one example implementation of one clock generation circuit for generating one example of a synchronized sample-and-hold clock signal and inverted sample-and-hold clock signal.

FIG. 3 shows a circuit diagram of one implementation 300 of a sample-and-hold control signal generation circuit to generate CLK and NCLK from a given CLK_IN. Referring to FIG. 3, the example 300 includes an inverter 302 formed of a stack of a PMOS FET (illustrated but not separately numbered) and an NMOS FET (illustrated but not separately numbered) connected between $V_{DD}$ and GND, and an always-on buffer 304 formed of a parallel connection of a PMOS pass transistor (illustrated but not separately numbered) and an NMOS pass transistor (illustrated but not separately numbered).

Continuing to refer to FIG. 3, in the example inverter 302, the source of the PMOS FET is connected to $V_{DD}$ and the drain of the PMOS FET is connected to the drain of the NMOS FET, that connection being a midpoint from which the NCLK is generated. The source of the NMOS FET of the inverter 302 is connected to GND. The given CLK_IN connects to the gates of both FETs in the inverter 302. As readily seen, of CLK_IN is at $V_{DD}$, the PMOS FET is OFF and the NMOS FET is ON, thereby the junction from which the NCLK signal is generated connecting to GND. The NCLK is therefore an inverted, and delayed, version of the CLK_IN signal. NCLK is delayed because of the inherent switching delay of the FETs forming the inverter 302. The amount of delay may be arbitrarily referenced as DL1 units of time.

With continuing reference to FIG. 3, the always-on buffer 304 generates CLK as a delayed, non-inverted, version of the CLK_IN signal. The amount of delay, DL2, is preferably identical to DL1 by, for example, forming the FETs of the buffer 304 to have the same, approximately the same physical parameters as relative physical arrangement as the FETs of the inverter 302. The buffer 304 is always on because the gate of its PMOS FET is connected to GND and its body is biased at $V_{DD}$, and the gate of NMOS FET is connected to $V_{DD}$ with its body biased at GND. The buffer 304 FETs are therefore strongly ON, such that the CLK signal swings through the full GND to $V_{DD}$ range.

The tolerance, in terms of a fixed range, or in terms of statistics, between the DL1 and DL2 is application dependent, readily specified or identified by a person of ordinary skill in the art of S/H circuits upon reading this disclosure, in view of the particular application. As readily understood by such persons, the maximum difference between DL1 and DL2 may be identified by modeling the circuit on, for example, SPICE, with the model specifying, or calculating, factors identifiable by such persons upon reading this disclosure such as, for example, the above-described Qhp, Qsp, Qhn and Qsn charge associated with the PMOS and NMOS switch FETs, respectively, and their associated PMOS and NMOS dummy FETs, the switching characteristics of each these FETs, the "Cgs" and "Cgd" values of each of these FETs, and relevant trace line delays and impedances.

As also readily understood by persons of ordinary skill in the art upon reading this disclosure, the maximum difference between DL1 and DL2, as well as the differences between the CLK and NCLK edges at various points throughout the actually implemented circuit, will affect the matching between the charge injections, and glitches exhibited by the operational signal switch FETs (i.e., PMOS switch FETs P1 and P2, and NMOS switch FETs N1 and N2) and the above-described counter-acting charge injections, and glitches exhibited by the dummy FETs (i.e., P3, P4, N3, N4) when arranged and operated in accordance with the above-described embodiments.

Figure 4A:
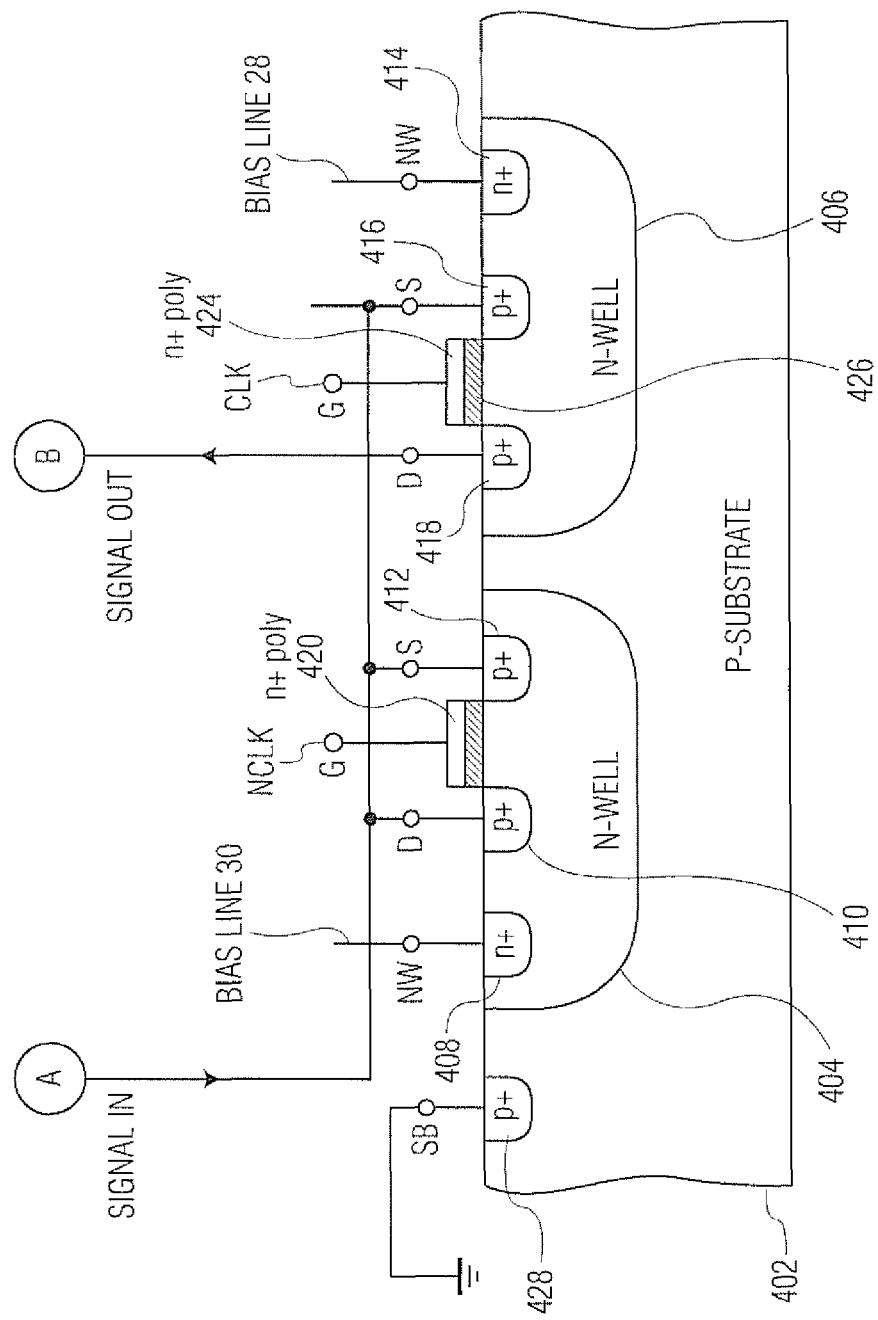
FIG. 4A depicts one example cross-sectional view of a semiconductor device arrangement to implement one example PMOS branch having an PMOS signal switch FET element and a corresponding PMOS dummy FET element combination according to one or more embodiments.

FIG. 4A is an illustration of one example abstracted cross-sectional view of one example branch of a PMOS switch circuit of a PMOS-NMOS S/H feed switch according to one or more of the various embodiments, such as, for example, one branch of the FIG. 1 example PMOS switch circuit 12. Referring to FIG. 4A, the example is formed on a P-substrate 402, having a first N-well 404 and a second N-well 406. The first N-well 404 may implement the body of a PMOS dummy FET such as P3 and the second N-well 406 may implement the body of its corresponding PMOS switch FET such as P1. The first N-well 404 may contain an n+ implant 408 forming the body connection b_P3 of the PMOS dummy FET P3, and p+ implants 410 and 412 may form the drain and the source of that FET P3. Similarly, the second N-well 406 may contain an n+ implant 414 forming the body connection b_P1 of the PMOS switch FET P1, and p+ implants 416 and 418 may form the source and the drain of that FET P1.

With continuing reference to FIG. 4A, the n+ implant 408 forming the body connection b_P3 of the PMOS dummy FET P3 may connect to a bias line such as, for example, the FIG. 1 bias line 30 and, similarly, the n+ implant 414 forming the body connection b_P1 of the PMOS switch FET P1 may connect to a bias line such as, for example, the bias line FIG. 1 bias line 28. A gate formed of an n+ poly 420 above a dielectric insulator layer 422 formed on the N-well 404 may connect to NCLK to function as the gate of the PMOS dummy FET P3. Likewise, a gate formed of an n+ poly 424 above a dielectric insulator layer 426 formed on the N-well 406 may connect to the CLK signal to form the gate of the PMOS switch FET P1. Preferably, but not necessarily, the P-substrate 402 is biased by a p+ implant 428 connected to GND.

Figure 4B:
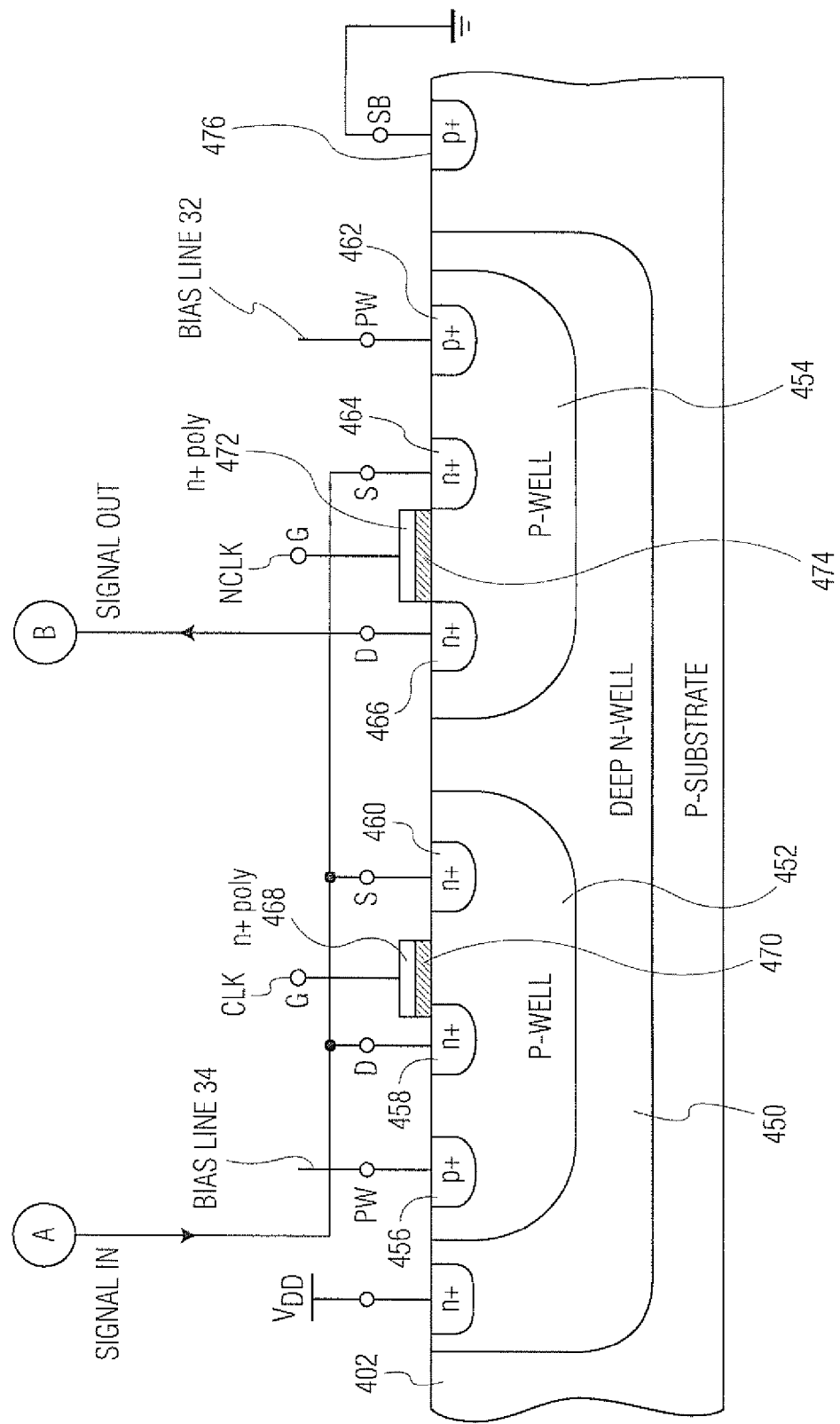
FIG. 4B depicts one example cross-section of a semiconductor device structure to implement one example NMOS branch having an NMOS signal switch FET element and a corresponding NMOS dummy FET element combination according to one or more embodiments.

FIG. 4B is an illustration of one example abstracted cross-sectional view of one example branch of an NMOS switch circuit of a PMOS-NMOS S/H feed switch according to one or more of the various embodiments, such as, for example, one branch of the FIG. 1 example NMOS switch circuit 14. Referring to FIG. 4B one example branch of the NMOS switch circuit 14 may, for example, be formed on the same P-substrate 402 shown at FIG. 4A on which the PMOS switch circuit 12 is formed. The FIG. 4B example includes a deep N-well 450, in which a first P-well 452 and a second P-well 454 are formed. The first P-well 452 may implement the body of an NMOS dummy FET such as N3 and the second N-well 454 may implement the body of its corresponding NMOS switch FET such as N1. Assuming the first P-well 452 forms the body of the dummy FET N3, that P-well may contain a p+ implant 456 forming the N3 body connection b_N3, and may include n+ implants 458 and 460 forming the drain and the source of the dummy FET N3. Assuming the second P-well 454 forms the body of the NMOS switch FET N1, that P-well may contain a p+ implant 462 forming the N1 body connection b_N1, and n+ implants 464 and 466 may form the source and the drain of that FET N1.

Continuing to refer to FIG. 4B, the p+ implant 456 forming the body connection b_N3 of the NMOS dummy FET N3 may connect to a bias line such as, for example, the FIG. 1 bias line 34 and, similarly, the p+ implant 462 forming the body connection b_N1 of the NMOS switch FET N1 may connect to a bias line such as, for example, the FIG. 1 bias line 32. A gate formed of, for example an n+ poly 468 above a dielectric insulator layer 470 formed on the P-well 452 may connect to a CLK line, to function as the gate of the NMOS dummy FET N3. A gate formed of an n+ poly layer 472 above a dielectric insulator layer 474 formed on the P-well 454 may connect to the NCLK signal to form the gate of the NMOS switch FET N1. As described in reference to FIG. 4A, preferably, but not necessarily, the P-substrate 402 is biased by a p+ implant 476 connected to GND.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention.

Accordingly, the foregoing disclosure, description, and figures are for illustrative purposes only and do not in any way limit the invention, which is defined only by the claims.

We hereby claim:

1. A sample/hold feed switch for switchably connecting and isolating an input node for receiving an input signal to and from an output node connectable to a sampling capacitor for holding a sample of the input signal, comprising:
a first PMOS signal branch and a second PMOS signal branch, each of said PMOS signal branches extending from the input node to the output node and each having a PMOS switch FET connected with corresponding PMOS dummy FET, each of said PMOS switch FETs and each of said PMOS dummy FETs having a respective gate and a respective body;
a first NMOS signal branch and a second NMOS signal branch, each of said NMOS signal branches extending from the input node to the output node and each having an NMOS switch FET connected with a corresponding NMOS dummy FET, each of said NMOS switch FETs and each of said NMOS dummy FETs having a respective gate and a respective body; and
a clock distribution circuit, configured to receive and distribute a clock signal (CLK) switching between a GND voltage and a $V_{DD}$ voltage to the gates of said PMOS switch FETs and to the gates of said NMOS dummy FETs, and receive and distribute an inverse signal (NCLK) of said CLK to the gates of the PMOS dummy FETs and the gates of the NMOS switch FETs; and
a FET bias sequence circuit configured to receive said CLK and said NCLK, and to receive a signal voltage on the input node and a held voltage on the output node and, synchronized with the CLK to bias the bodies of the PMOS switch FETs, the bodies of the NMOS switch FETs, the bodies of the PMOS dummy FETs and the bodies of the NMOS dummy FETs to different bias levels in different operation modes.

2. The sample/hold feed switch of claim 1, further comprising a clock generation circuit to generate said CLK and said NCLK,
wherein a first PMOS switch FET in the first PMOS signal branch has a source connected to the input node and a drain connected to the output node, and a second PMOS switch FET in the second PMOS signal branch has a drain connected to the input node and a source connected to the output node,
wherein each of the first and the second PMOS switch FETs has a gate connected to said CLK, and
wherein each of the first and the second PMOS switch FETs is configured to form a respective conducting channel between its respective source and its respective drain in response to said CLK being at the GND voltage, and to remove said conducting channel in response to said CLK being at the $V_{DD}$ voltage.

3. The sample/hold feed switch of claim 2,
wherein the clock generator circuit receives a given clock signal CLK_IN to generate a CLK and an inverse of said CLK (NCLK) in response, said clock generator circuit including
an inverter formed by one PMOS transistor having a given PMOS transistor size and one NMOS transistor having a given NMOS transistor size to receive the CLK_IN and, in response, generate said NCLK, and an always-on buffer to receive said CLK_IN and, in response, to generate said CLK, said always-on buffer formed by a PMOS transistor having said given PMOS transistor size and an NMOS transistor having said given NMOS transistor size.

4. The sample/hold feed switch of claim 1,
wherein a first PMOS dummy FET in the first PMOS signal branch has a source directly connected to the source of the first PMOS switch FET and a drain directly connected to the input node, the source and the drain of the first PMOS dummy FET connected by a low impedance metal wire located between the source of the first PMOS switch FET and the input node, and
wherein a second PMOS dummy FET in the second PMOS signal branch has a source directly connected to the source of the second PMOS switch PET and a drain directly connected to the output node, the source and the drain of the second PMOS dummy FET connected by a low impedance metal wire located between the source of the second PMOS switch FET and the output node, and each of the first and the second PMOS dummy FETs has a gate connected to said NCLK.

5. The sample/hold feed switch of claim 1,
wherein a first NMOS dummy FET in the first NMOS signal branch has a source directly connected to the source of the first NMOS switch FET and a drain directly connected to the input node, the source and the drain of the first NMOS dummy PET connected by a low impedance metal wire located between the source of the first NMOS switch FET and the input node,
wherein a second NMOS dummy PET in the second NMOS signal branch has a source directly connected to the source of the second NMOS switch PET and a drain directly connected to the output node, the source and the drain of the second NMOS dummy FET connected by a low impedance metal wire located between the source of the second NMOS switch FET and the output node, and
wherein each of the first and the second NMOS dummy FETs has a gate connected to said CLK.

6. The sample/hold feed switch of claim 1, further comprising a clock generation circuit to generate said CLK and said NCLK,
wherein a first NMOS switch FET in the first NMOS signal branch has a source connected to the input node and a drain connected to the output node, and a second NMOS switch FET in the second NMOS signal branch has a source connected to the output node and a drain connected to the input node,
wherein each of the first and the second NMOS switch FETs has a gate connected to said NCLK, and wherein each of the first and the second NMOS switch FETs is configured to form a respective conducting channel between its respective source and its respective drain in response to said NCLK being at the $V_{DD}$ voltage, and to remove said conducting channel in response to said NCLK being at the GND voltage.

7. The sample/hold feed switch of claim 1,
wherein each of the PMOS switch FETs, each of the PMOS dummy FETs, each of the NMOS switch FETs, and each of the NMOS dummy FETs has a corresponding body connection connected to its respective body, and
wherein each of said body connections connects to the FET bias sequence circuit.

8. The sample/hold feed switch of claim 7, wherein the FET bias sequence circuit further comprises:
an NMOS switch FET bias sequence circuit, comprising
a fifth switch receiving said CLK and, in response to said CLK being at said GND voltage, having an ON state connecting the input node to the body connections of the NMOS switch FETs and, in response to said CLK being at said $V_{DD}$ voltage, having an OFF state disconnecting the input node from the body connections of the NMOS switch FETs;
a sixth switch receiving said NCLK and, in response to said NCLK being at said GND voltage, having an ON state connecting the GND voltage to the body connections of the NMOS switch FETs and, in response to said NCLK being at said $V_{DD}$ voltage, an OFF state disconnecting the GND voltage from the body connections of the NMOS switch FETs; and
an NMOS dummy FET bias sequence circuit, comprising
a seventh switch receiving said NCLK and, in response to said NCLK being at said GND voltage, having an ON state connecting the output node to the body connections of the NMOS dummy FETs and, in response to said NCLK being at said VDD voltage, having an OFF state disconnecting the output node from the body connections of the NMOS dummy FETs; and
an eighth switch receiving said CLK and, in response to said CLK being at said GND voltage, having an ON state connecting the GND voltage to the body connections of the NMOS dummy FETs and, in response to said CLK being at said VDD voltage, an OFF state disconnecting the GND voltage from the body connections of the NMOS dummy FETs.

9. The sample/hold feed switch of claim 7, wherein the FET bias sequence circuit includes:
a PMOS switch FET bias sequence circuit, comprising
a first switch receiving said CLK and, in response to said CLK being at said GND voltage, having an ON state connecting the input node to the body connections of the PMOS switch FETs and, in response to said CLK being at said $V_{DD}$ voltage, having an OFF state disconnecting the input node from the body connections of the PMOS switch FETs;
a second switch receiving said NCLK and, in response to said NCLK being at said GND voltage, having an ON state connecting the $V_{DD}$ voltage to the body bias connections of the PMOS switch FETs and, in response to said NCLK being at said $V_{DD}$ voltage, an OFF state disconnecting the $V_{DD}$ node from the body connections of the PMOS switch FETs; and
a PMOS dummy FET bias sequence circuit, comprising
a third switch receiving said CLK and, in response to said CLK being at said GND voltage, having an ON state connecting the $V_{DD}$ voltage to the body connections of the PMOS dummy FETs and, in response to said CLK being at said $V_{DD}$ voltage, having an OFF state disconnecting the $V_{DD}$ voltage from the body connections of the PMOS dummy FETs; and
a fourth switch receiving said NCLK and, in response to said NCLK being at said GND voltage, having an ON state connecting the output node to the body connections of the PMOS dummy FETs and, in response to said NCLK being at said $V_{DD}$ voltage, an OFF state disconnecting the output node from the body connections of the PMOS dummy FETs.

10. The sample/hold feed switch of claim 7,
wherein the FET bias sequence circuit connects to said body connections through a plurality of body bias lines, including a PMOS switch FET bias line connected to the body connections of the PMOS switch FETs, a PMOS dummy FET bias line connected to the body connections of the PMOS dummy FETs, an NMOS switch FET bias line connected to the body connections of the NMOS switch FETs and an NMOS dummy FET bias line connected to the body connections of the NMOS dummy FETs.

11. The sample/hold feed switch of claim 10,
wherein the FET bias sequence circuit is configured to receive said CLK, said NCLK signal, the input signal, the held signal, the GND and the $V_{DD}$ supply, and is configured to connect, concurrent with the CLK being at the GND voltage, the input node to the PMOS switch FET bias line and to the NMOS switch bias line, the $V_{DD}$ voltage to the PMOS dummy FET bias line, and the GND voltage to the NMOS dummy FET bias line, and is configured to connect, concurrent with the CLK being at the $V_{DD}$ voltage, the $V_{DD}$ voltage to the PMOS switch FET bias line, the GND voltage to the NMOS switch bias line, and the output node to the PMOS dummy FET bias line and to the NMOS dummy FET bias line.

12. The sample/hold feed switch of claim 1,
wherein each of the PMOS switch FETs in the first PMOS signal branch and the second PMOS signal branch has a given PMOS geometry, given performance-related PMOS dimensions and a given PMOS physical implementation orientation, and
wherein each of the PMOS dummy FETs in the first PMOS signal branch and the second PMOS signal branch has a PMOS geometry, performance-related PMOS dimensions, and a PMOS physical implementation orientation same as said given PMOS geometry, said given performance-related PMOS dimensions and said given PMOS physical implementation orientation.

13. The sample/hold feed switch of claim 1,
wherein each of the NMOS switch FETs in the first NMOS signal branch and the second NMOS signal branch has a given NMOS geometry, given performance-related NMOS dimensions and a given NMOS physical implementation orientation, and
wherein each of the NMOS dummy FETs in the first NMOS signal branch and the second NMOS signal branch has an NMOS geometry, performance-related NMOS dimensions, and an NMOS physical implementation the same as said given NMOS geometry, said given performance-related NMOS dimensions and said given NMOS physical implementation orientation.

14. The sample/hold feed switch of claim 1, wherein the input signal comprises a common-mode voltage.

15. The sample/hold feed switch of claim 1, further comprising:

a first gate-to-source capacitance and a first gate-to-drain capacitance connected to the first PMOS signal switch FET; and a second gate-to-source capacitance and a second gate-to-drain capacitance connected to the second PMOS signal switch FET, wherein the switching capacitor, the first and second gate-to-source capacitances, and the first and second gate-to-drain capacitances produce a switch offset voltage.

16. The sample/hold feed switch of claim 15, further comprising:

a third gate-to-source capacitance and a third gate-to-drain capacitance connected to the first PMOS dummy FET; and a fourth gate-to-source capacitance and a fourth gate-to-drain capacitance connected to the second PMOS dummy FET, wherein the switching capacitor, the third and fourth gate-to-source capacitances, and the third and fourth gate-to-drain capacitances produce a dummy offset voltage.

17. The sample/hold feed switch of claim 16, wherein the dummy offset voltage is approximately equal to the switch offset voltage.

18. The sample/hold feed switch of claim 1, further comprising:

a first gate-to-source capacitance and a first gate-to-drain capacitance connected to the first NMOS signal switch FET; and a second gate-to-source capacitance and a second gate-to-drain capacitance connected to the second NMOS signal switch FET, wherein the switching capacitor, the first and second gate-to-source capacitances, and the first and second gate-to-drain capacitances produce a switch offset voltage.

19. The sample/hold feed switch of claim 18, further comprising:

a third gate-to-source capacitance and a third gate-to-drain capacitance connected to the first NMOS dummy FET; and a fourth gate-to-source capacitance and a fourth gate-to-drain capacitance connected to the second NMOS dummy FET, wherein the switching capacitor, the third and fourth gate-to-source capacitances, and the third and fourth gate-to-drain capacitances produce a dummy offset voltage.

20. The sample/hold feed switch of claim 19, wherein the dummy offset voltage is approximately equal to the switch offset voltage.

* * * * *